United States Patent [19]

Plus et al.

[11] Patent Number: 4,833,644
[45] Date of Patent: May 23, 1989

[54] MEMORY CELL CIRCUIT HAVING RADIATION HARDNESS

[75] Inventors: Dora Plus, South Bound Brook; Roger G. Stewart, Hillsborough Township, Somerset County, both of N.J.

[73] Assignee: General Electric Company, Schenectady, N.Y.

[21] Appl. No.: 900,520

[22] Filed: Aug. 26, 1986

[51] Int. Cl.$^4$ .............. G11C 7/00; G11C 11/40; G11C 11/24
[52] U.S. Cl. .................... 365/53; 365/149; 365/154; 365/189.01
[58] Field of Search ............. 365/149, 53, 154, 156, 365/95, 189

[56] References Cited

U.S. PATENT DOCUMENTS

| | | | |
|---|---|---|---|
| 3,990,056 | 11/1976 | Luisi et al. | 365/154 |
| 4,130,892 | 12/1978 | Gunckel II et al. | 365/154 |
| 4,149,268 | 4/1979 | Waters | 365/95 |
| 4,314,359 | 2/1982 | Kato et al. | 365/155 X |
| 4,538,244 | 8/1985 | Sugo et al. | 365/154 X |
| 4,590,508 | 5/1986 | Hirakawa et al. | 357/41 |
| 4,760,557 | 7/1988 | Stewart et al. | 365/156 X |

FOREIGN PATENT DOCUMENTS

| | | | |
|---|---|---|---|
| 0081208 | 6/1983 | European Pat. Off. | 365/156 |
| 156363 | 12/1980 | Japan | 357/29 |
| 61208698 | 9/1986 | Japan | 365/156 |

OTHER PUBLICATIONS

Herbert et al. "SOS Test Structures for Measurement of Photocurrent Sources and Upset Dose Rates in Memories", DNA/Aerospace Corp. Workshop on Test Structures for Radiation Hardening and Hardness Assurance, Feb. 19, 1986.

Primary Examiner—Stuart N. Hecker
Assistant Examiner—Alyssa H. Bowler
Attorney, Agent, or Firm—Henry I. Steckler; James C. Davis, Jr.; Paul R. Webb, II

[57] ABSTRACT

A memory cell circuit has a pair of inverters and a means, such as gate-drain coupled capacitors, for providing a greater voltage difference at MOS transistor gates during radiation than an initial value. This tends to preserve the latch logic state and thus prevent a change in logic state during radiation.

8 Claims, 3 Drawing Sheets

MEMORY CELL CIRCUIT HAVING RADIATION HARDNESS

The Government has rights in this invention pursuant to Subcontract No. A6ZV-700000-E-507 under Contract No. F04701-84-C-0061 awarded by the Department of the Air Force.

BACKGROUND OF THE INVENTION

The present invention relates to a memory cell circuit for use in a random access memory (RAM), and more particularly, to such a cell that is radiation hard.

A typical RAM cell comprises two cross-coupled inverters, with each inverter comprising a pair of metal oxide semiconductor (MOS) transistors. Each pair has a series connected P-conductivity type channel (PMOS) transistor and a N-conductivity type channel (NMOS) transistor. This RAM may be used while exposed to all types of radiation, such as cosmic rays or to high energy electromagnetic nuclear radiation pulses, that produces electrons and holes. These charges can change the gate voltage of a MOS transistor which, in turn, can cause a change in the logic state of the memory cell.

It is known to use in a memory cell circuit resistors coupled between the output of one inverter and the input of a second inverter and a capacitor coupled between the gates of the two inserters to raise the cell resistance to radiation induced changes of the logic state. The added resistors and capacitors increase the time constant of the cell state so that the radiationinduced current pulse cannot cause a change in state of a cell. However, such a circuit has been found to be not completely effective when the entire circuit is exposed to high dose gamma or X-ray radiation.

It is therefore desirable to provide a memory cell circuit that enhances the stability of the latched logic state and resists a change in logic state even when the entire cell is subject to all types of radiation.

SUMMARY OF THE INVENTION

A memory cell circuit in accordance with the invention comprises:

first and second cross-coupled inverters, each inverter having first and second complemtary MOS series coupled tansistors, each of said transistors having a pair of conduction electrodes and a gate input electrode, one of said conduction electrodes being an output electrode coupled to the output electrode of the respective complementary transistor; and a first capacitor coupled between said gate input electrodes of said first and second transistors of said first inverter, and the conduction output electrodes of said first inverter transistors, and a second capacitor coupled between said gate input electrodes of said first and second transistors of said second inverter, and the conduction output electrodes of said second inverter transistors.

Corresponding reference numerials are applied to correspondong elements in the FIGURES.

DETAILED DESCRIPTION OF THE PREFERRED EMBODIMENTS

Figure 1:
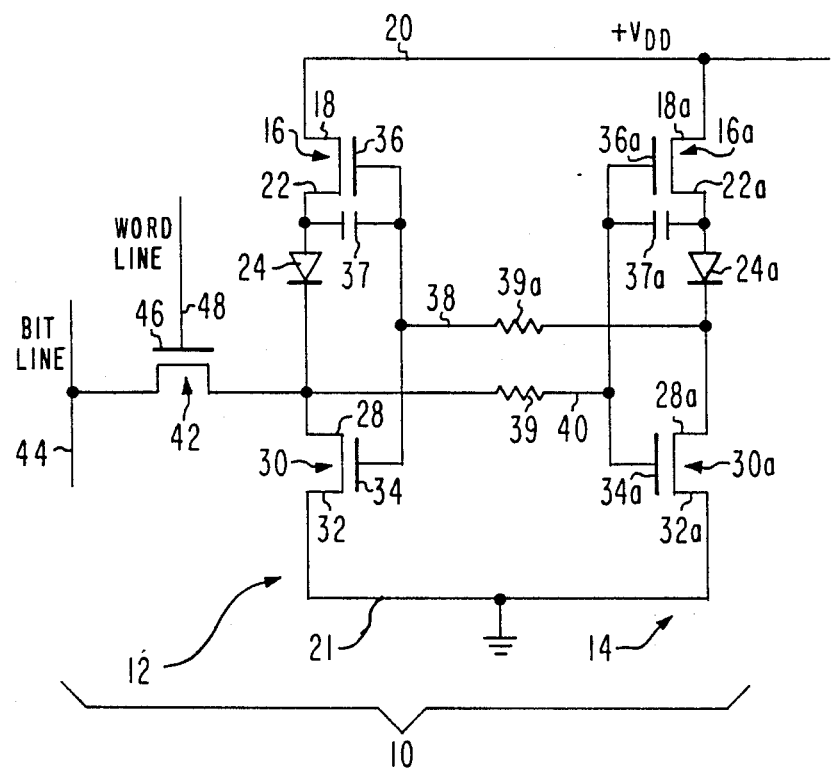
FIG. 1 is a schematic circuit drawing of an embodiment of the invention.

FIG. 1 shows a static memory cell 10 comprising cross-coupled first and second inverters 12 and 14. In inverter 12, PMOS enhancement mode first transistor 16 has a conduction electrode or source 18 coupled to rail 20 to which a positive supply voltage, $V_{DD}$, typically between about 5 and 15 volts, is applied. A conduction electrode or drain 22 of transistor 16 is coupled to an anode of a diode 24. The cathode of the diode 24 is coupled to a conduction electrode or drain 28 of an NMOS enhancement-mode second transistor 30. The transistor 30 has a conduction electrode or source 32 htat is coupled to a rail 21, which is grounded, and a gate electrode 34 that is coupled to a gate electrode 36 of the transistor 16. A first capacitor 37 is coupled between the gates 34 and 36 and the drain 22 of the first transistor 16. Alternately, the capacitor 37 can be coupled between said gates and the drain 28.

The inverter 14 shown in the right hand portion of FIG. 1, is identical to that of inverter 12 and, therefore, will not be described. Corresponding reference numerals have been used on corresponding circuit elements with the suffix "a" added.

The gates 34 ad 36 are connected to the junction of the diode 24a and the drain 28a of transistor 30a by line 38 and a resistor 39a; the gates 34a and 36a are connected to the junction of the diode 24 and the drain 28 by a line 40 and the resistor 39. An MOS access transistor 42 has a conduction electrode connected to the resistor 39, the diode 24, the drain 28; another conduction electrode of the transistor 42 is connected to a bit line 44, and a gate 46 is connected to word line 48.

A precharge voltage of $V_{DD}/2$ is applied to the bit line 44 to initiate operation of the cell 10. To write a ZERO into the cell 10, the access transistor 42 is turned ON by setting the voltage on the word line 48 to $V_{DD}$. Further, a data line (not shown) coupled to the bit line 44 reduces the bit line voltage to zero volts. The voltage at the gates 34a and 36a is now equal to zero. Hence, the transistor 30a is OFF, and the transistor 16a is ON. Thus the voltage at the gates 34 and 36 is equal to $V_{DD}$, thereby making the transistor 30 ON, and the transistor 16 OFF.

To write a ONE into the cell 10, the access transistor 42 is turned ON as described above, and the data line directly applies the voltage $V_{DD}$ to bit line 44. The voltage at the gates 34a and 36a is now equal to $V_{DD}$. The transistor 16a is now OFF, and the transistor 30a is now ON. Thus the voltage at the gates 34 and 36 is zero volts, thereby making transistor 16 ON, and the transistor 30 now OFF.

To read the cell 10, the transistor 42 is turned ON by setting the word line 48 to $V_{DD}$. If the cell 10 is storing a ZERO, then the voltage on the line 44 drops from $V_{DD}/2$ towards zero volts. If the cell 10 is storing a ONE, the voltage on the line 44 rises from $V_{DD}/2$ towards $V_{DD}$. A sense amplifier (not shown) that has an input coupled to the bit line 44 senses these voltage changes.

In the presence of radiation, electron-hole pairs are generated in all cell materials, which then disassociate when an electric field is present. This causes a surge current that lowers the voltage on the rail 20 and raises the voltage on the rail 21 (called "power rail collapse").

The changes on the rail voltages are coupled through the ON transistor 16 or 16a to the drain 22 or 22a thereof, respectively, and then through the capacitor 37 or 37a, respectively, to the gate 36 or 36a, respectively. This drives the ON transistor 16 or 16a further ON and thus tends to strengthen the latched logic state of the cell 10.

For example, if the cell 10 is storing a ONE, then the drains 22 and 28 and the gates 34a and 36a have $V_{DD}$ (5 volts) thereon, the drains 22a and 28a, and the gates 34 and 36 have zero volts thereon. Thus the transistors 16 and 30a are ON and the transistors 16a and 30 are OFF. If, during a very high rate gamma or X-ray radiation pulse, the power rails collapse by 2.2 volts, then the voltages on the rails 20 and 21 are now $5-2.2=2.8$ volts and $0+2.2=2.2$ volts, respectively. The 2.2 volts drop on the rail 20 is applied through the ON transistor 16 to the source 22 thereof and then through the capacitor 37 to the gates 34 and 36. Thus the voltage on the gates 34 and 36 is now $0-2.2=-2.2$ volts. Similarly, the 2.2 volts rise on the rail 21 is applied through the ON transistor 30a to the drain 28a thereof and then through the capacitor 37a to the gates 34a and 36a. Thus the voltage on the gates 34a and 36a is now $5+2.2=7.2$ volts. Therefore during power rail collapse the difference between the voltage on the gates 34 and 36 and the gates 34a and 36a is $7.2-(-2.2)=9.4$ volts, which is almost double the difference of 5 volts before the collapse. This drives the transistors 16 and 30a further into ON state and the transistors 16a and 30 further into the OFF state, thereby helping the cell 10 resist a change in logic state during radiation.

If the cell 10 is storing a ZERO, then the same effect occurs. Thus the first and second capacitors 37 and 37a and the first and second resistors 39 and 39a comprise a means for providing a voltage difference at the gates 36, 34 and 36a and 34a during radiation greater than an initial voltage therebetween.

A "sudden event upset" (SEU) is defined as a change in the logic state of the cell 10 due to radiation of particles such as heavy metals and alpha particles. Typically such particles produce a photocurrent pulse of about 0.2 ns as compared to photocurrent pulses of about 50 ns produced by nuclear radiation. It has been found that the resistance of the diodes 24 and 24a during such a short duration current transient is sufficiently high that a voltage drop of about 2 to 4 volts occurs thereacross instead of the more typical voltage drop of 0.6 volts during steady state operation. This drop helps prevent the occurrence of an SEU by buffering the radiation induced voltage change on the drains 22 or 22a from the gates 34a and 36a or 34 and 36, respectively.

Further, the effective values of the capacitors 37 and 37a are greatly amplified due to the Miller effect, which is the increased effective input capacitance due to the amplification of an active device. This reduces the toggle rate of the cell 10 and thus also helps the cell 10 resist a change in logic state during gamma, X-ray and particle radiation.

Figure 2:
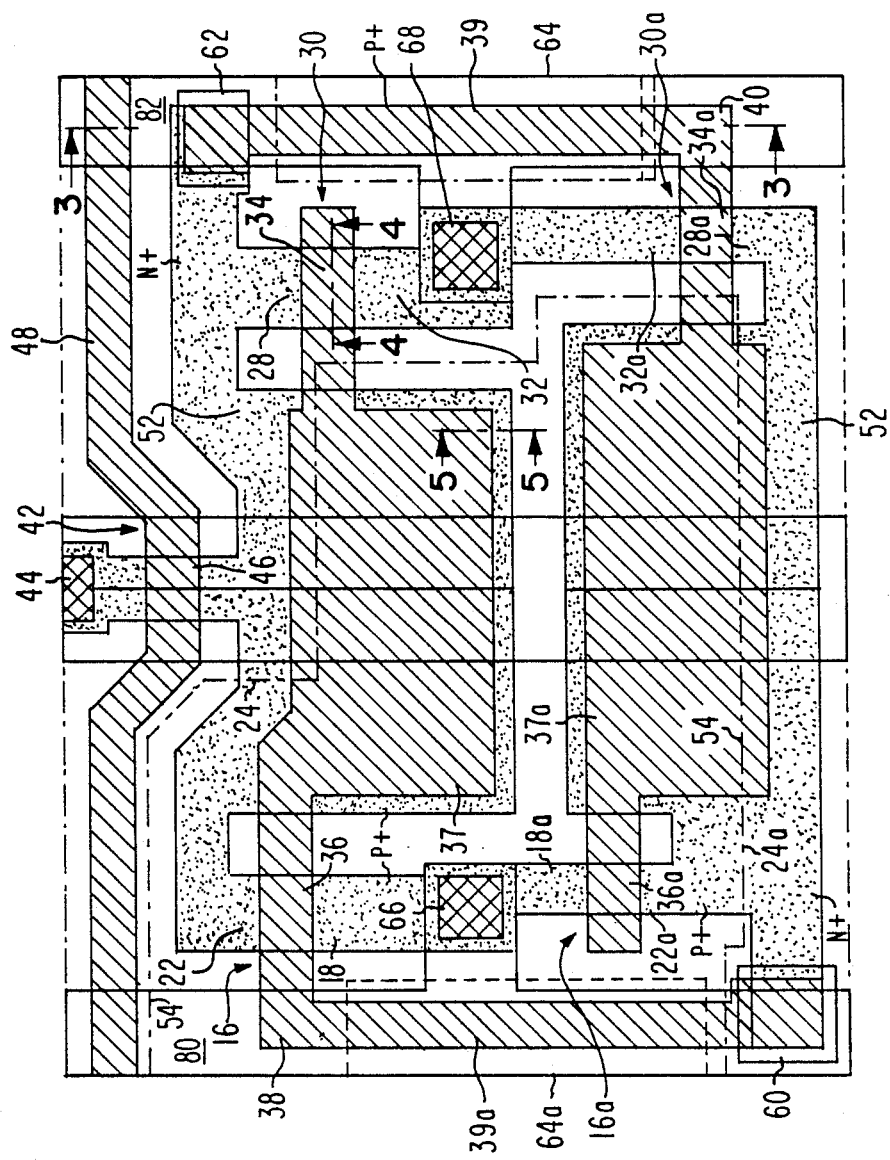
FIG. 2 is a top view of an integrated embodiment of the circuit of FIG. 1.

Referring now to FIGS. 2, 3, 4, and 5, the structure of an embodiment of the circuit of FIG. 1 comprises an insulating body or substrate 50 having disposed thereon an overlaying conducting layer 52 indicated in FIG. 2 as a dotted area. A dot-dash line 54 in FIG. 2 is the junction between those areas of the layer 52 (where it exists) that are doped P+ and N+. The diodes 24 and 24a are indicated where they occur at this junction. The channel regions are undoped. Also formed in the layer 52 are the sources and drains of the transistors 16, 16a, 30, 30a and 42 and as well as the bottom plates of each of the capacitors 37 and 37a.

As can be seen in FIG. 2, the layout is symmetrical. In particular, the transistors 16 and 30 have identical device size as do the transistors 16a and 30a. This results in identical transient photocurrents for symmetrical coupling to the sensitive gates thereof. Further all four of the transistors can have the same device size, if desired. The capacitors 37 and 37a have disposed near the center of the cell 10 in order to minimize collecting photocurrents from adjacent cells (not shown). Their photocurrents can be readily collected by the capacitors 37 and 37a, if said capacitors are positioned near the periphery of the cell 10, due to the large area of said capacitors. Also the capacitors 37 and 37a are symmetrically disposed, have substantially identical capacitance values and nearly the same physical size. This results in an equal voltage change at the capacitor plates during radiation, thereby reducing the likelihood of a chnage in logic state of the cell 10.

All of the top surface of the substrate 50 that is not covered by the conducting layer 52 is covered by an insulating barrier layer 56. Overlying the insulating layer 56 is a conducting layer 58 indicated in FIG. 2 by diagonal shading. The substrate 50 and the layers 56 and 58 comprise three different materials (described in detail below). It is believed that the energy band differences of the materials as well as their interface conditions help the layer 56 serve as a barrier to carrier flow between the conducting layer 52 and portions of the conducting layer 58 through the substrate 50.

In the conducting layer 58 are formed the resistors 39 and 39a, interconnecting conductors such as the word line 48, the remaining upper plate of each of the capacitors 37 and 37a, and the gates 36, 34, 36a, and 34a of each of the transistors 16, 30, 16a and 30a, respectively. The resistors 39 and 39a decouple the large bottom plate of the capacitors 37 and 37a, respectively, from the sensitive gates 34a and 36a and also 34 and 36, respectively. This minimizes the sensitivity of a change in logic state due to photocurrents collected in the bottom plates.

In FIG. 2 buried contacts 60 and 62 are where the layers 52 and 58 contact each other, while windows 64 and 64a are areas where the resistors 39 and 39a, respectively, are formed. Contacts 66 and 68 are coupled to $V_{DD}$ and ground, respectively. Conductors 80 and 82 are connected to the contacts 66 and 68, respectively.

Figure 3:
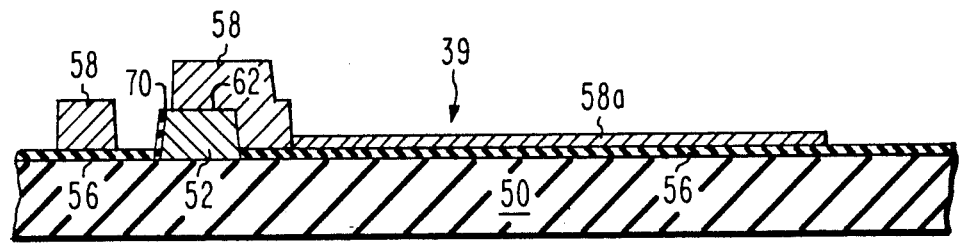
FIGS. 3, 4, and 5 are cross-sections of the integrated circuit (IC) of FIG. 2 taken along the lines 3—3', 4—4', and 5—5', respectively.

FIG. 3 shows a cross-sectional view of the construction details of the resistor 39 and thus also the identical resistor 39a. In particular, the resistor 39 comprises a heavily doped conducting portion 58a of the layer 58, which is thin to achieve the required high resistance value (100,000 ohms). The thin heavily doped portion 58a provides improved transient radiation stability due to the lower carrier (holes and electrons) mobilities, shorter carrier lifetime and reduced generation and collection volume. In particular, the reduced volume as compared to a thicker resistor of the same value made of the same material with a lower doping level minimizes the number of electron-hole pairs generated by radiation, and therefore minimizes radiation induced photocurrent in the portion 58a. Further, it has been found that for the same reasons the resistance of the resistors 39 and 39a changes by only a factor of two over a temperature range of $-55°$ C. to $+125°$ C. as compared with a factor of five over the same temperature range for a conventional thicker lower doping level resistor. The insulating layer 56 is also mode thin so that photoconduction therein is minimized for the same reasons stated above. This reduces the conduction path photocurrent between the various devices and the resistors 39 and 39a thereby minimizing the possibility of a change in the logic state of the cell 10 during a radiation pulse.

Figure 4:
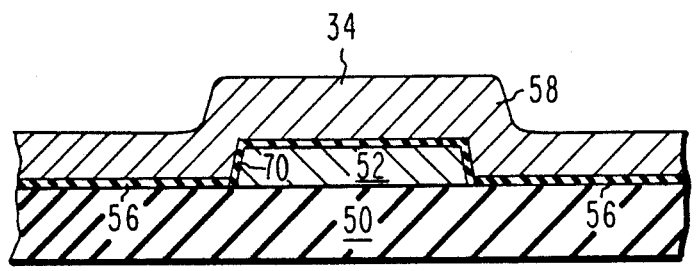

FIG. 4 shows a cross-sectional view of the transistor 30 in the width direction, i.e. perpendicular to the source 32-to-drain 28 axis. A channel insulating layer 70 overlies the conducting layer 52, and the conducting layer 58 overlies the layer 70. Thus, the layer 58 comprises the gate electrode 34. The thin insulating layer 56 is disposed between the conducting layer 58 and the substrate 50 to serve as a barrier to photocurrents from the layer 58 through the substrate 50 to other conductors of the cell 10.

Figure 5:
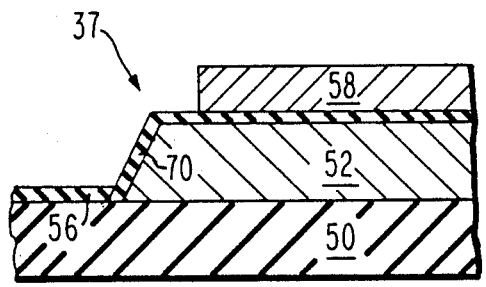

FIG. 5 is a cross-sectional view of the edge of the capacitor 37. The channel insulating layer 70 comprises the dielectric disposed between the conducting layers 52 and 58 comprising the plates of the capacitor 37. The upper plate of the capacitor 37 is intentionally formed as an extension of the gate 36. It is noted that most of the periphery of the layer 58 lies within (is recessed) the periphery of the layer 52 to avoid direct contact with the substrate 50, which generates the majority of the photocurrents, see also FIG. 2. This recess, together with the insulating layer 70, minimizes photocurrents from the layer 58 from going to other conductors of the cell 10. Due to the presence of the layer 56, the layer 58 need not be recessed since the layer 56 will serve as a photoconduction barrier and thus a larger capacitance can be provided.

As stated above, the different portions of the conducting layer 58 forms the gates 34 and 36 of the transistors 30 and 16, respectively, and also the gates 34a and 36a of the transistors 30a and 16a, respectively, as well as the upper plates of the capacitors 37 and 37a. Since photocurrents between the layer 58 and other circuit nodes are minimized as described above, this arrangement further minimizes the photocurrent effects that cause a change in the cell 10 logic state. This is especially true for the gates, which are the most sensitive electrode of the transistor due to the amplification thereof.

The substrate 50 can comprise an insulator such as sapphire ($Al_2O_3$), a silicon oxide, or spinel. The construction of the resistor 39 as shown in FIG. 3 can also be used in conventional, i.e., non-SOI, structures; in this case the substrate 50 can comprise an inexpensive semiconductor such as bulk silicon (Si). The conducting layer 52 can comprise a semiconductor such as Si, preferably a single crystal epitaxially formed with the substrate 50 and having a thickness of about 700 nm. The source, drain, and capacitor plate typically have doping levels of about $10^{20}$ cm$^{-3}$. The barrier layer 56 can comprise an insulator such as a silicon oxide having a maximum thickness of about 300 nm. If the barrier layer 56 is too thin, it will be a less effective barrier to photocurrents due to direct tunneling of carriers, while if it is too thick significant numbers of holes and electrons are generated within the layer 56 itself during radiation. In a particular embodiment a thickness of 100 nm worked well. The layer 56 can also comprise a material that is different from both the layers 52 and 58 and has a wider band gap than the layers 52 and 58. The channel insulating layer 70 can comprise a good quality insulator such as a grown silicon oxide having a thickness of about 50 nm. The conducting layer 58 (except for the portion 58a) can comprise a conductor such as polkycrystalline Si (polsilicon or p-Si) having a thickness of about 800 nm. The portion 58a comprises p-Si and has a maximum thickness of about 100 nm. In a particular embodiment a thickness of 75 nm was used. A doping level of about $10^{20}$ cm$^{-3}$ is used for the layer 58 and a minimum doping level of about $3 \times 10^{17}$ cm$^{-3}$ is used for the portion 58a. In a particular embodiment a doping level of $10^{18}$ cm$^{-3}$ was used for the portion 58a. The layer 58 can also comprise a metal such as CrSi with the portion 58a having a controlled alloy coposition to achieve the desired value of resistance. The bit line 44, the contacts 66 and 68, and the conductors 80 and 82 can comprise a good conductor such as aluminum.

EXAMPLE

A circuit and structure in accordance with said particular embodiment of the invention did not change logic state even at a radiation dose rate of $6.5 \times 10^{11}$ rads/sec.

COUNTEREXAMPLE

In contradistinction a circuit and structure without a barrier layer, resistors, and capacitors changed logic state at a radiation dose rate of $1.5 \times 10^{11}$ rads/sec.

It will therefore be appreciated that by using the circuit in accordance with the invention a memory cell is produced that resists a change in state when subject to high dose rate radiation.

What is claimed is:

1. A memory cell circuit comprising:
   first and second cross-coupled inverters, each inverter having first and second complementary MOS series coupled transistors, each of said transistors having a pair of conduction electrodes and a gate input electrode, one of said conduction electrodes being an output electrode coupled to the output electrode of the respective complementary transistor; and
   a first capacitor coupled between said gate input electrodes of said first and second transistors of said first inverter, and the conduction output electrodes of said first inverter transistors, and a second capacitor coupled between said gate input electrodes of said first and second transistors of said second inverter, and the conduction output electrodes of said second inverter transistors.

2. The cell of claim 1 wherein said capacitors have about equal capacitance values.

3. The cell of claim 2 wherein said capacitors have about the same physical size.

4. The cell of claim 1 further comprising a first resistor coupled between said gate electrodes of said first inverter transistors and a conduction electrode of said second transistor of said second inverter, and a second resistor coupled between said gate electrodes of said second inverter transistors and a conduction electrode of said second transistor of said first inverter.

5. The cell of claim 4 wherein said capacitors comprise a lower plate and an upper plate lying substantially within the periphery of said lower plate.

6. The cell of claim 4 wherein said resistors have about equal resistance values.

7. The cell of claim 1 wherein said each of said capacitors comprise upper and lower plates coupled to said gate and conduction output electrodes, respectively.

8. The cell of claim 1 wherein said first and second transistors of said first inverter have about the same physical size and structure and said first and second transistors of said second inverter have about the same physical size and structure.

* * * * *